United States Patent
Tanaka et al.

(10) Patent No.: US 10,128,316 B2
(45) Date of Patent: Nov. 13, 2018

(54) SEMICONDUCTOR MEMORY DEVICE

(71) Applicant: TOSHIBA MEMORY CORPORATION, Minato-ku (JP)

(72) Inventors: Chika Tanaka, Fujisawa (JP); Masumi Saitoh, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/699,254

(22) Filed: Sep. 8, 2017

(65) Prior Publication Data

US 2018/0269257 A1 Sep. 20, 2018

(30) Foreign Application Priority Data

Mar. 16, 2017 (JP) ................. 2017-051102

(51) Int. Cl.
*G11C 5/02* (2006.01)
*H01L 27/24* (2006.01)
*H01L 45/00* (2006.01)
*G11C 13/00* (2006.01)

(52) U.S. Cl.
CPC ...... *H01L 27/2481* (2013.01); *G11C 13/0023* (2013.01); *H01L 45/1253* (2013.01); *G11C 13/0038* (2013.01)

(58) Field of Classification Search
CPC ............. H01L 27/2481; H01L 45/1253; G11C 13/0023; G11C 13/0038

USPC .......................................................... 365/51
See application file for complete search history.

(56) References Cited

U.S. PATENT DOCUMENTS

| 7,019,391 | B2 | 3/2006 | Tran | |
|---|---|---|---|---|
| 2010/0067279 | A1* | 3/2010 | Choi | G11C 8/14 365/51 |
| 2015/0194211 | A1 | 7/2015 | Sills | |

FOREIGN PATENT DOCUMENTS

| JP | 2013-41961 A | 2/2013 |
|---|---|---|
| JP | 2015-520909 A | 7/2015 |

* cited by examiner

*Primary Examiner* — Huan Hoang
(74) *Attorney, Agent, or Firm* — Oblon, McClelland, Maier & Neustadt, L.L.P.

(57) ABSTRACT

This semiconductor memory device includes: global first wiring lines; global second wiring lines; and memory blocks connected to the global first wiring lines and the global second wiring lines. The memory block includes: local first wiring lines; local second wiring lines; and memory cells connected to the local first wiring lines and the local second wiring lines. The memory cell includes: a variable resistance element; first electrodes disposed on a first surface of the variable resistance element; and second electrodes arranged on a second surface of the variable resistance element. The first electrodes are connected to the local first wiring lines, and the second electrodes are connected to the local second wiring lines.

20 Claims, 7 Drawing Sheets

SEMICONDUCTOR MEMORY DEVICE

CROSS-REFERENCE TO RELATED APPLICATIONS

This application is based upon and claims the benefit of Japanese Patent Application No. 2017-051102, filed on Mar. 16, 2017, the entire contents of which are incorporated herein by reference.

BACKGROUND

Field

Embodiments described herein relate to a semiconductor memory device.

Description of Related Art

In recent years, there has been proposed a semiconductor memory device that employs as its memory cell a variable resistance element whose resistance value is reversibly changed. In such a semiconductor memory device, applying a certain voltage to the memory cell causes a filament to be formed or annihilated in the variable resistance element in the memory cell, whereby the resistance value of the memory cell is reversibly changed to store data.

Regarding such a semiconductor memory device, there has been proposed a semiconductor memory device capable of executing a multi-valued cell system where two or more bits of data are stored in one memory cell. For example, there has been proposed a semiconductor memory device configured such that by forming a plurality of electrodes in one memory cell, a plurality of kinds of filament paths can be formed in the one memory cell.

However, there is a problem that in order to achieve a multi-valued cell in such a multi-valued cell system semiconductor memory device, wiring line connections between the memory cell and a peripheral circuit become complicated, and so-called area penalty increases.

Semiconductor memory devices according to embodiments described below provide a semiconductor memory device capable of achieving a multi-valued cell system without increasing area penalty.

DETAILED DESCRIPTION

A semiconductor memory device according to one embodiment includes: a plurality of global first wiring lines extending in a first direction; a plurality of global second wiring lines extending in a second direction intersecting the first direction; and a plurality of memory blocks each connected to one of the plurality of global first wiring lines and one of the plurality of global second wiring lines. The memory block includes: a plurality of local first wiring lines extending in the first direction, the plurality of local first wiring lines being divided into a plurality of first wiring groups; a plurality of local second wiring lines extending in the second direction, the plurality of local second wiring lines being divided into a plurality of second wiring groups; and a plurality of memory cells each connected to a plurality of the local first wiring lines in one of the plurality of the first wiring groups and connected to a plurality of the local second wiring lines in one of the plurality of the second wiring groups. The memory cell includes: a variable resistance element; a plurality of first electrodes disposed on a first surface of the variable resistance element; and a plurality of second electrodes disposed on a second surface of the variable resistance element different from the first surface. The plurality of first electrodes are each connected to each of the local first wiring lines in one of the first wiring groups, and the plurality of second electrodes are each connected to each of the local second wiring lines in one of the second wiring groups.

Embodiments of a semiconductor memory device will be described below with reference to the drawings.

First Embodiment

First, a semiconductor memory device according to a first embodiment will be described.

Figure 1:
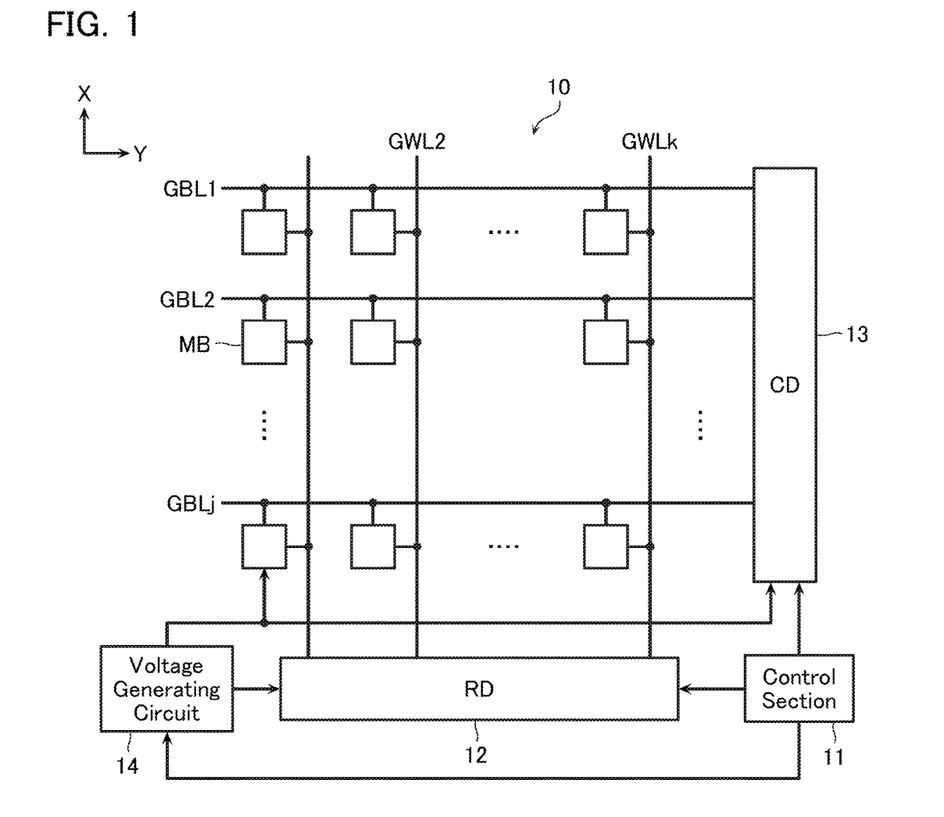
FIG. 1 is a block diagram showing an overall configuration of a semiconductor memory device according to a first embodiment.

FIG. 1 is a block diagram showing an overall configuration of the semiconductor memory device according to the first embodiment. This semiconductor memory device is mainly configured from a memory cell array 10, a control section 11, a row decoder 12, a column decoder 13, and a voltage generating circuit 14.

The memory cell array 10 is configured having memory blocks MB disposed in a matrix, for example. As will be mentioned later, the memory block MB includes a plurality of memory cells MC. A plurality of global bit lines GBL (GBL1-GBLj: global first wiring lines) that have a Y direction as their longitudinal direction (extending in a Y direction) and are disposed with a certain pitch in an X direction and global word lines GWL (GWL1-GWLk: global second wiring lines) that have the X direction as their longitudinal direction (extending in the X direction) and are disposed with a certain pitch in the Y direction to intersect the global bit lines GBL, are disposed in the memory cell array 10. The memory blocks MB are disposed in a matrix corresponding to intersection regions of the plurality of global bit lines GBL and the plurality of global word lines GWL. The memory blocks MB are each connected to one of the plurality of global bit lines GBL and one of the plurality of global word lines GWL.

Note that although illustration thereof is omitted in FIG. 1, local bit lines LBL (local first wiring lines) and local word lines LWL (local second wiring lines) are also arranged in the memory cell array 10. As will be mentioned later, each of a plurality of the local bit lines LBL intersects a plurality of the local word lines LWL and the plurality of the local bit lines LBL and the plurality of the local word lines are connected to one memory cell MC (cross-point structure).

The control section 11 controls the memory block MB, the row decoder 12, column decoder 13, and the voltage generating circuit 14 to execute the likes of a write operation, a read operation, and an erase operation on the memory cell MC.

The row decoder 12 selects the global word line GWL based on an instruction from the control section 11. Moreover, the column decoder 13 selects the global bit line GBL based on an instruction from the control section 11.

The voltage generating circuit 14 generates a voltage required in the write operation, the read operation, and the erase operation based on an instruction from the control section 11.

Next, a configuration of the memory block MB will be described with reference to FIG. 2. Each of the memory blocks MB includes a plurality of the memory cells MC, a local bit line selector 15, and a local word line selector 16.

As will be mentioned later, the memory cell MC is configured from a variable resistance element and a plurality of electrodes.

A plurality of the local bit lines LBL and the local word lines LWL are each arranged in the memory block MB. The local bit lines LBL have the X direction as their longitudinal direction (extend in the X direction) and are arranged with a certain pitch in the Y direction. The local word lines LWL have the Y direction as their longitudinal direction (extend in the Y direction) and are arranged with a certain pitch in the X direction, and intersect the local bit lines LBL.

Additionally, the plurality of the local bit lines LBL are divided into a plurality of bit line groups. For example, one of the bit line groups includes the local bit lines LBL00, LBL01, . . . LBL0$m$. A plurality of the local bit lines LBL in one of the bit line groups are commonly connected to one memory cell MC. Similarly, the plurality of the local word lines LWL are divided into a plurality of word line groups. For example, one of the word line groups includes the local word lines LWL00, LWL01, . . . LWL0$m$. A plurality of the local word lines LWL in one of the word line groups are commonly connected to one memory cell MC. The local bit lines LBL in one bit line group and the local word lines LWL in one word line group are disposed on an upper surface and a lower surface of one memory cell MC so as to intersect each other.

Figure 2:
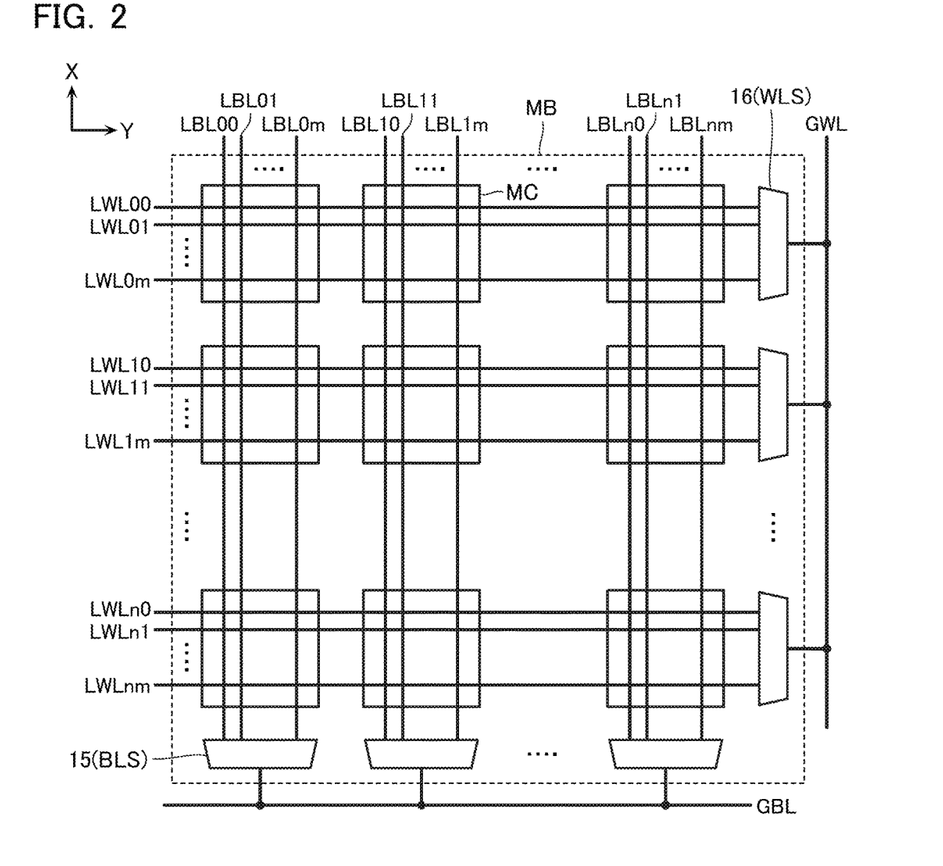
FIG. 2 explains a configuration of a memory block MB shown in FIG. 1.

FIG. 2 shows an example where (n+1) rows and (n+1) columns of memory cells MC are disposed in one memory block MB, and (m+1) local bit lines LBL and (m+1) local word lines LWL are each connected to one memory cell MC. For example, the top left memory cell MC has (m+1) local bit lines LBL00-LBL0$m$ disposed above it and has (m+1) local word lines LWL00-LWL0$m$ disposed below it.

The local bit line selector 15 is disposed for each of the bit line groups (for each single column of the memory cells MC lined up in the X direction), and in the example of FIG. 2, (n+1) local bit line selectors 15 are disposed in one memory block MB. Each of the local bit line selectors 15 is connected to the plurality of (in the example of FIG. 2, (m+1)) local bit lines LBL connected to one column of memory cells MC, and is configured capable of selecting one of those local bit lines LBL based on a signal of the global bit line GBL and a selection signal from the control section 11. The selected local bit line LBL is connected to the global bit line GBL by the local bit line selector 15.

The local word line selector 16 is disposed for each of the word line groups (for each single row of the memory cells MC lined up in the Y direction), and in the example of FIG. 2, (n+1) local word line selectors 16 are disposed in one memory block MB. Each of the local word line selectors 16 is connected to the plurality of (in the example of FIG. 2, (m+1)) local word lines LWL connected to one row of memory cells MC, and is configured capable of selecting one of those local word lines LWL based on a signal of the global word line GWL and a selection signal from the control section 11. The selected local word line LWL is connected to the global word line GWL by the local word line selector 16.

Figure 3:
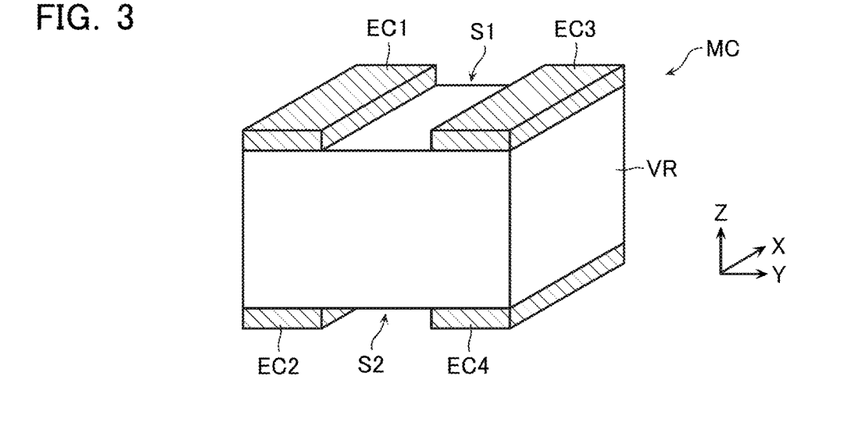
FIG. 3 is a perspective view showing a configuration of one memory cell MC.
Figure 4:
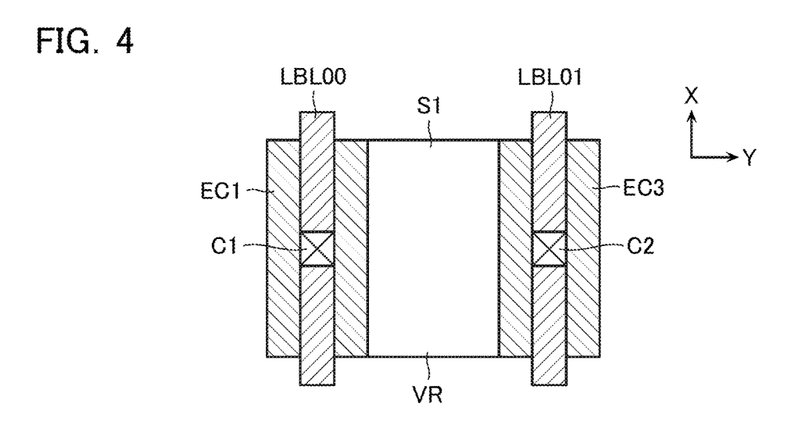
FIG. 4 is a plan view showing the configuration of one memory cell MC.
Figure 5:
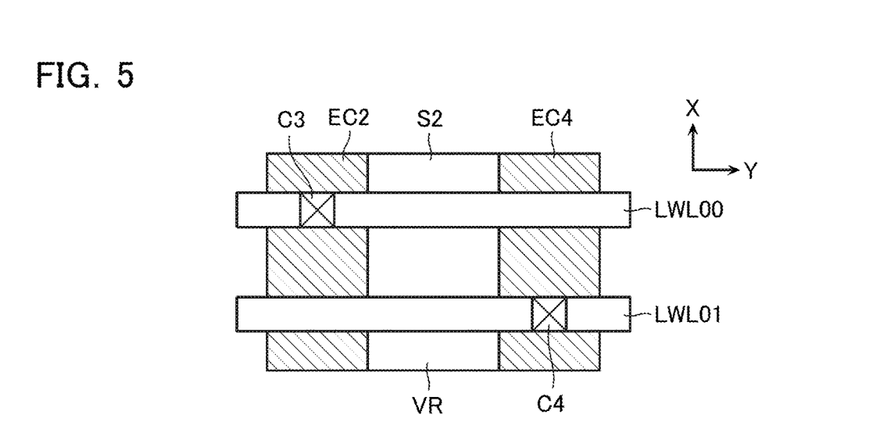
FIG. 5 is a bottom view showing the configuration of one memory cell MC.

Next, a structure of one memory cell MC will be described with reference to FIGS. 3 to 5. FIG. 3 is a perspective view showing a configuration of one memory cell MC. Moreover, FIGS. 4 and 5 are respectively a plan view and a bottom view of one memory cell MC. Note that FIGS. 3 to 5 show an example where the bit line group has two local bit lines LBL000, LBL01 and the word line group has two word lines LWL00, LWL01.

The memory cell MC includes a variable resistance element VR and a plurality of electrodes EC. In this example of FIGS. 3 to 5, the memory cell MC includes four electrodes and two pairs of them are disposed on two different surfaces of the variable resistance element VR. The variable resistance element VR includes a substance configured so as to allow a filament acting as a current path to be formed on its inside when applied with a voltage, and may be configured by the likes of a transition metal oxide such as hafnium oxide (HfOx), for example.

The variable resistance element VR has a rectangular shape like that shown in FIG. 3, for example, and has an opposing first surface S1 and second surface S2. The rectangular shape of the variable resistance element VR is merely an example, and the shape does not matter if it is a shape having two surfaces that are independent.

Moreover, two or more electrodes of the plurality of electrodes EC are disposed on the first surface S1, and the remaining two or more electrodes are disposed on the second surface S2. In this example, the two electrodes EC1, EC3 (first electrodes) are disposed on the first surface S1, and the two electrodes EC2, EC4 (second electrodes) are disposed on the second surface S2.

A shape of the electrode EC is not limited to a specific shape. However, the plurality of electrodes EC formed on one surface are disposed so as to be electrically insulated from each other.

Moreover, a positional relationship of the electrodes EC that oppose each other sandwiching the variable resistance element VR is not limited to a specific positional relationship either. However, they preferably overlap in at least part of an XY plane. By the electrodes EC1, EC3 overlapping the electrodes EC2, EC4 in the XY plane (when viewed from Z direction), a filament path can be formed by a shortest distance in the variable resistance element VR when a certain voltage has been applied. In the example of FIG. 3, the electrodes EC1-EC4 all have the X direction as their longitudinal direction, and have a certain width and are disposed with a certain distance between them in the Y direction. Moreover, positions in the XY plane of the electrodes EC1, EC3 and positions in the XY plane of the electrodes EC2, EC4 match.

Moreover, as shown in FIG. 4, the local bit lines LBL (LBL00, LBL01) are wired on the electrodes EC1, EC3 on a first surface S1 side and are connected to the electrodes EC1, EC3 via contacts (conductors) C1, C2. The local bit lines LBL00, LBL01 are both disposed having the X direction as their longitudinal directions and are respectively connected to either of the electrodes EC1, EC3.

On the other hand, as shown in FIG. 5, the local word lines LWL (LWL00, LWL01) are wired on the electrodes EC2, EC4 on a second surface S2 side and are connected to the electrodes EC2, EC4 via contacts (conductors) C3, C4. The local word lines LWL00, LWL01 are both disposed having the Y direction as their longitudinal directions and are respectively connected to either of the electrodes EC2, EC4. Therefore, positions of the contacts C3 and C4 in the X direction are different from each other. Note that positions of the contacts C3 and C4 in the Y direction are also different from each other. The contacts C3 and C4 are disposed at where the local word lines LWL and the electrodes EC2, EC4 intersects. Although the local word lines LWL00, LWL01 are wired so as to straddle the two electrodes EC2, EC4, the local word lines LWL00, LWL01 are connected via the contact C3 or C4 to only one of the electrodes EC2, EC4.

In this way, the memory cell MC of the present embodiment is connected to a plurality of local bit lines LBL via a plurality of electrodes and contacts at a first surface, while being connected to a plurality of local word lines LWL via a plurality of electrodes and contacts at a second surface different from the first surface. Selecting one of the plurality of local bit lines LBL and selecting one of the plurality of local word lines LWL connected to one memory cell MC in such a connection state makes it possible for a plurality of kinds of filament paths to be formed in one memory cell MC.

Figure 6:
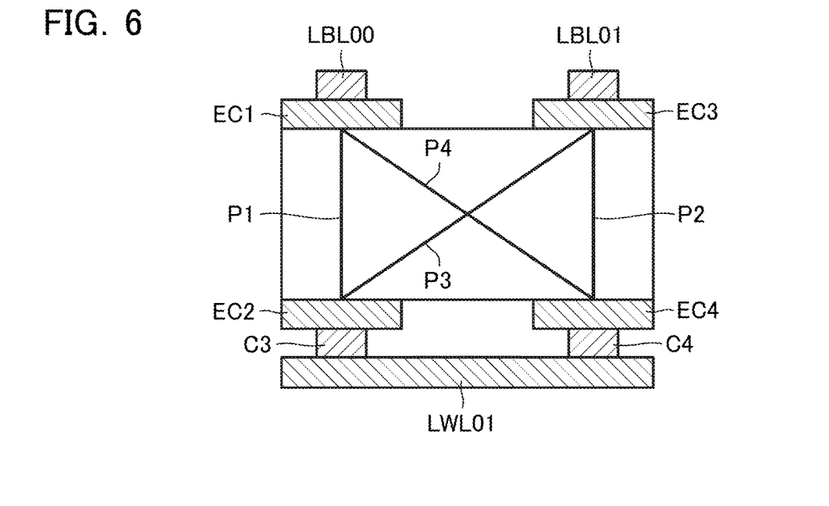
FIG. 6 shows filament paths formable in the memory cell MC of the first embodiment.

In the case like that shown in FIGS. 3 to 5 where two each of the electrodes are formed on both surfaces, four kinds of filament paths P1-P4 can be formed as shown in FIG. 6. For example, when forming the filament path P1, a voltage V1 is applied to the local bit line LBL00, while 0 V is applied to the local word line LWL00. On the other hand, the local bit line LBL01 and the local word line LWL01 are applied with a voltage V1/2 which is half of the voltage V1, as an example. As a result, the voltage V1 required in the write operation is applied only between the local bit line LBL00 and the local word line LWL00, and the filament path P1 can be formed between the electrode EC1 and the electrode EC2.

Note that in the example of FIGS. 3 to 5, the electrodes EC1-EC4 are each disposed having the X direction as their longitudinal directions, and are disposed such that the local word lines LWL extending in the Y direction straddle a plurality of the electrodes EC. However, it is also possible that, contrarily to this, the electrodes EC1-EC4 are disposed having the Y direction as their longitudinal directions, and are disposed such that the local bit lines LBL straddle a plurality of the electrodes EC (in this case, each of the local bit lines LBL is connected via the contact to only one of the plurality of electrodes EC straddling one memory cell MC).

Figure 7:
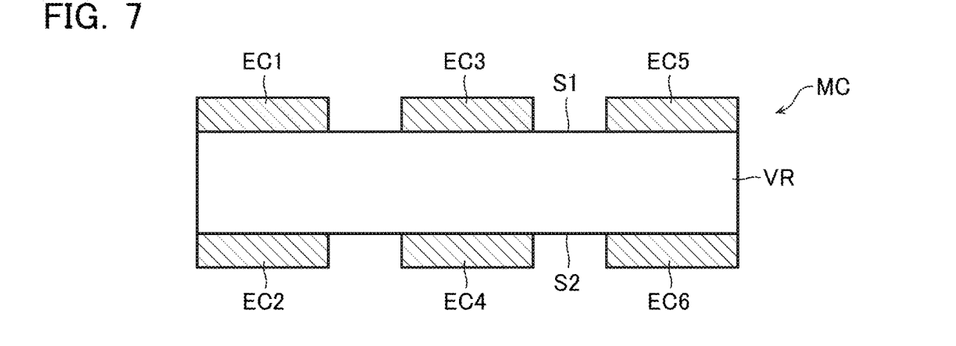
FIG. 7 shows a modified example of the first embodiment.
Figure 8:
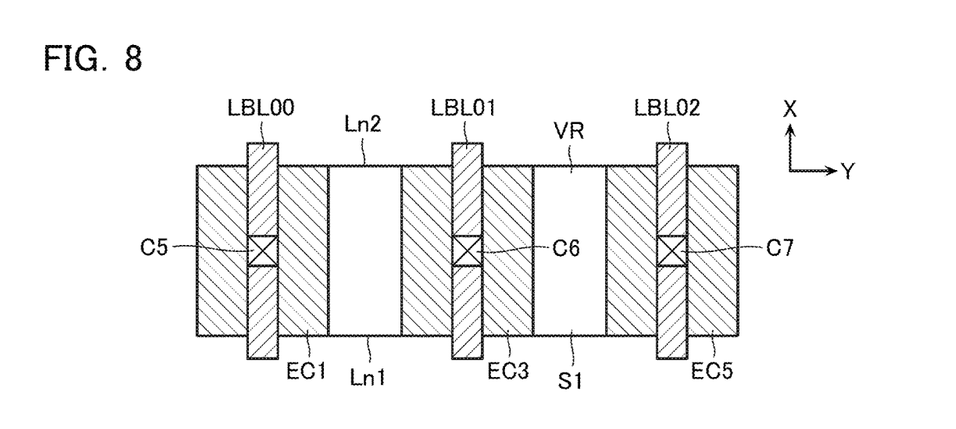
FIG. 8 shows the modified example of the first embodiment.

FIGS. 3 to 5 show an example where two electrodes are formed on each of two surfaces of the memory cell MC (variable resistance element VR). The number of electrodes formed on one surface is not limited to this, and it is of course possible for a number of three or more to be set. FIGS. 7 and 8 show an example where three electrodes EC1, EC3, EC5 are disposed on the first surface S1, and three electrodes EC2, EC4, EC6 are disposed on the second surface S2. In this case, the bit line group has three local bit lines LBL00, LBL01, LBL02 and the word line group has three word lines LWL00, LWL01, LWL02. Similar to the case of FIGS. 3 to 5, there being no limit on the shape and positional relationship of the electrodes EC1-EC6 even in this example of FIG. 7. As shown in FIG. 8, on the first surface S1, the electrodes EC1, EC3, EC5 extend having the X direction as their longitudinal directions and are disposed so as to be divided from each other (separated from each other) in the Y direction and electrically insulated. Moreover, local bit lines LBL00, LBL01, LBL02 are respectively connected, via contacts (conductors) C5, C6, C7, to these electrodes EC1, EC3, EC5.

Figure 9:
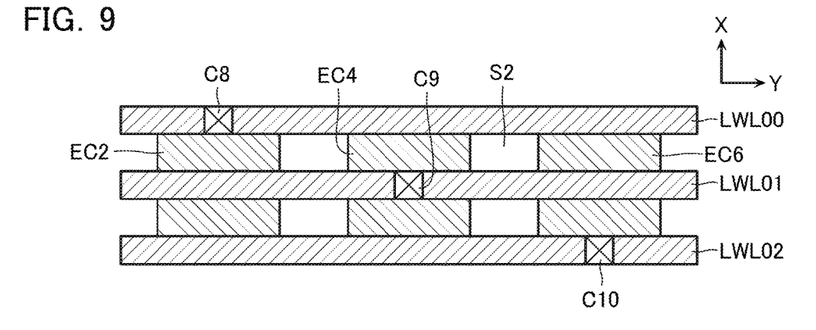
FIG. 9 shows the modified example of the first embodiment.

Moreover, as shown in FIG. 9, on the second surface S2, the electrodes EC2, EC4, EC6 extend having the X direction as their longitudinal directions and are disposed so as to be divided from each other in the Y direction and electrically insulated. Moreover, three local word lines LWL00, LWL01, LWL02 are wired so as to straddle such electrodes EC2, EC4, EC6. These local word lines LWL00, LWL01, LWL02 are each connected only to one of the electrodes EC2, EC4, EC6 via a contact (conductor) C8, C9, or C10.

As described above, in the first embodiment, a plurality of local bit lines LBL and a plurality of local word lines LWL that intersect each other are respectively connected to two surfaces of one memory cell MC (variable resistance element VR), and by any of the local bit lines LBL and local word lines LWL being selected, multi-valued data can be stored in one memory cell MC. In other words, configuring a cross-point type structure in one memory cell MC makes it possible for a plurality of bits of data to be stored in one cell. Because the local bit lines LBL and the local word lines LWL can each be arranged with a minimum wiring line pitch, area penalty also can be reduced.

Second Embodiment

Figure 10:
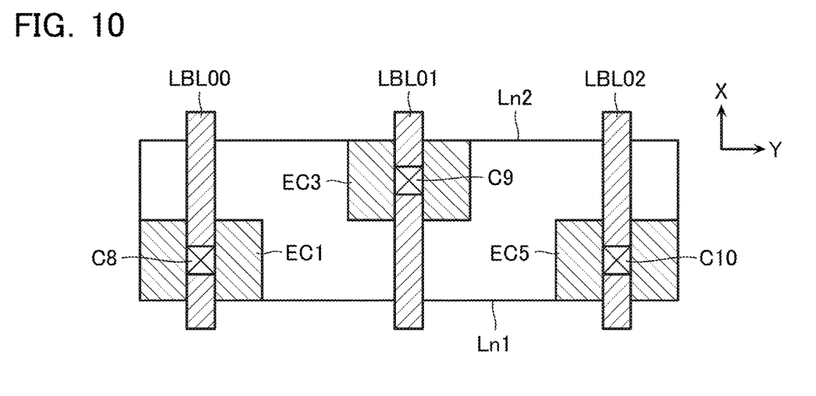
FIG. 10 is a plan view showing a configuration of a memory cell MC of a semiconductor memory device according to a second embodiment.
Figure 11:
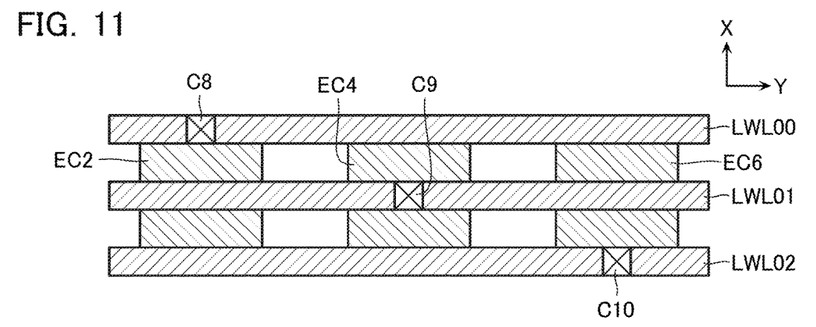
FIG. 11 is a bottom view showing the configuration of the memory cell MC of the semiconductor memory device according to the second embodiment.
Figure 12:
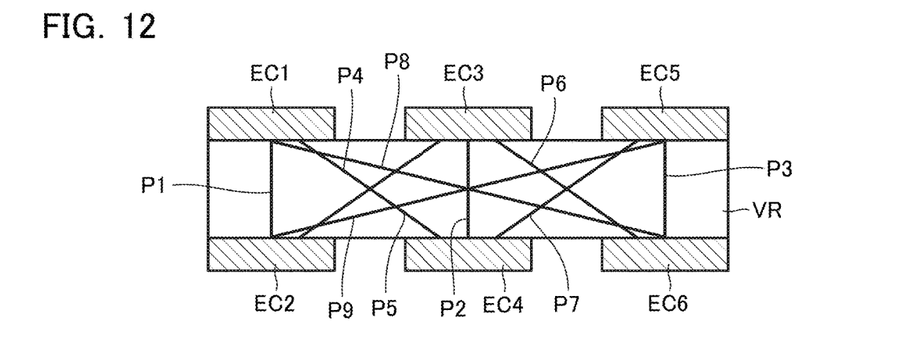
FIG. 12 shows filament paths formed in the memory cell MC of the semiconductor memory device according to the second embodiment.

Next, a semiconductor memory device according to a second embodiment will be described with reference to FIGS. 10 to 12. An overall configuration of this second embodiment is similar to that of the first embodiment (FIGS. 1 and 2). However, in the semiconductor memory device of this second embodiment, a configuration of the memory cell MC is different from in the first embodiment. FIG. 10 is a plan view of a first surface S1 side of the memory cell MC of the second embodiment. Moreover, FIG. 11 is a plan view of a second surface S2 side of the memory cell MC. In addition, FIG. 12 shows filament paths formable in one memory cell MC in this second embodiment. Note that even in this second embodiment, although description is made exemplifying the case where the number of electrodes EC formed on one surface of the variable resistance element VR is three, this number is not limited to three, and a number exceeding three is of course possible. The configuration of this embodiment is a configuration effective when the number of electrodes formed on one surface is three or more.

In the memory cell MC of this second embodiment, disposition of the electrodes EC1, EC3, EC5 on the first surface S1 of the variable resistance element VR is different from in the first embodiment. In the first embodiment, the electrodes EC1, EC3, EC5 are disposed so as to extend from a first end section Ln1 to a second end section Ln2 in the X direction of the variable resistance element VR (memory cell MC, FIG. 8).

In contrast, in the second embodiment, at least one of the electrodes EC1, EC3, EC5 has an end section disposed between the first end section Ln1 and the second end section Ln2. For example, in an example shown in FIG. 10, the electrodes EC1, EC5 on both sides in the Y direction are disposed so as to extend from the first end section Ln1 but not reach the second end section Ln2 on an opposite side, and to end at a position along the way in the X direction. That is, each of the electrodes EC1, EC5 has an end section positioned at the first end section L1 and the other end section positioned between the first end section L1 and the second end section L2. On the other hand, the electrode EC3 positioned in a center is disposed so as to conversely extend from the second end section Ln2 in the X direction and to end at a position along the way in the X direction. That is, the electrode EC3 has an end section positioned at the second end section L2 and the other end section positioned between the first end section L1 and the second end section L2. In this way, the plurality of electrodes disposed on the first surface S1 are disposed such that positions of their end sections differ. In the semiconductor memory device of the second embodiment, it is possible for the number of filament paths formable in one memory cell MC to be increased more, whereby a storage capacity of the semiconductor memory device can be increased more, compared to in the first embodiment.

Specifically, as shown in FIG. 12, by any of the three local bit lines LBL connected to the electrodes EC1, EC3, EC5 being selected and any of the three local word lines LWL connected to the electrodes EC2, EC4, EC6 being selected in the memory cell MC of this second embodiment, it becomes possible for the nine types of filament paths P1-P9 shown in FIG. 12 to be formed.

In the case of the memory cell MC of the first embodiment, since the electrode EC3 is formed so as to extend from the first end section Ln1 to the second end section Ln2, it is difficult to form the filament path P8 extending from the electrode EC1 to the electrode EC6 and the filament path P9 extending from the electrode EC2 to the electrode EC5. However, in this second embodiment, because the position of the end section of the electrode EC3 is configured so as to differ from the position of the end sections of the electrodes EC1, EC5, it is possible to form the filament paths P8 and P9 so as to avoid directly below this electrode EC3. Therefore, as a result of this second embodiment, the number of filament paths formable in one memory cell MC can be increased and the storage capacity of the semiconductor memory device can be increased.

Figure 13:
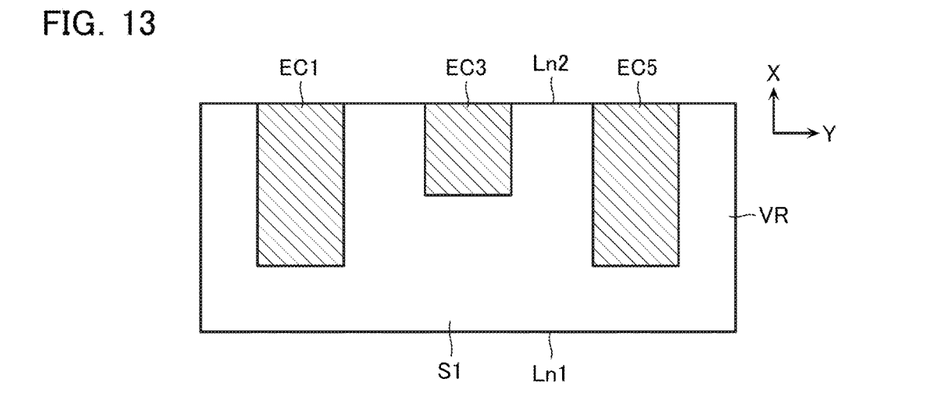
FIG. 13 shows a modified example of the second embodiment.

Note that a form that positions of the end sections of the electrodes EC1, EC3, EC5 disposed on the first surface S1 are made different is not limited to the disposition of FIG. 10. For example, as shown in FIG. 13, it is possible to configure such that positions of one of the end sections of the electrodes EC1, EC3, EC5 are aligned on a second end section Ln2 and distances the electrodes EC1, EC3, EC5 extend from the second end section Ln2 differ. That is, it is possible to configure such that the other of the end section of the electrode E3 is positioned between the other of the end section of the electrode E1 and the second end section Ln2. This also enables the filament paths P8 and P9 to be formed, and makes it possible for advantages identical to those in the case of the configuration of FIG. 10 to be obtained.

Figure 14:
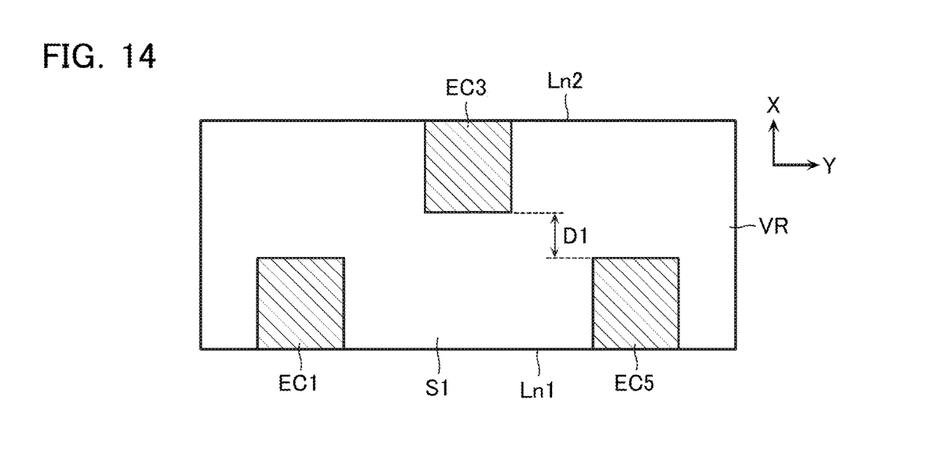
FIG. 14 shows a modified example of the second embodiment.

FIG. 14 further shows another example of disposition of the electrodes EC1, EC3, EC5. In this FIG. 14, the position of the end section of the electrode EC3 does not reach the position of the end sections of the electrodes EC1, EC5 in the X direction, and the two positions are separated to an extent of a distance D1 in the X direction. In other words, the end sections of the electrodes EC1, EC5 are nearer to the first end section Ln1 than the end section of the electrode EC3. Additionally, the end section of the electrode EC3 is nearer to the second end section Ln2 than the end sections of the electrodes EC1, EC5. This configuration also makes it possible for advantages identical to those of the configuration of FIG. 10 to be obtained.

Figure 15:
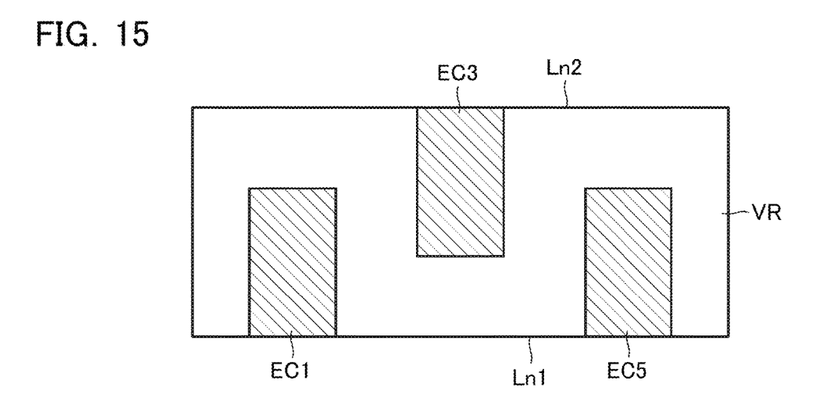
FIG. 15 shows a modified example of the second embodiment.

In FIG. 15, contrarily to in FIG. 14, the position of the end section of the electrode EC3 extends in the end section Ln1 direction exceeding the position of the end sections of the electrodes EC1, EC5 in the X direction. Therefore, the electrode EC3 and the electrodes EC1, EC5 overlap to an extent of a certain distance in the X direction. In other words, the end sections of the electrodes EC1, EC5 are nearer to the second end section Ln2 than the end section of the electrode EC3. Additionally, the end section of the electrode EC3 is nearer to the first end section Ln1 than the end sections of the electrodes EC1, EC5. Due to there being a position where the electrodes EC1 and EC5 and the electrode EC3 do not overlap in the X direction, it is possible for the filament paths P8 and P9 to be formed in that portion, hence, even in this case, advantages identical to those of the configuration of FIG. 10 can be obtained.

Third Embodiment

Figure 16:
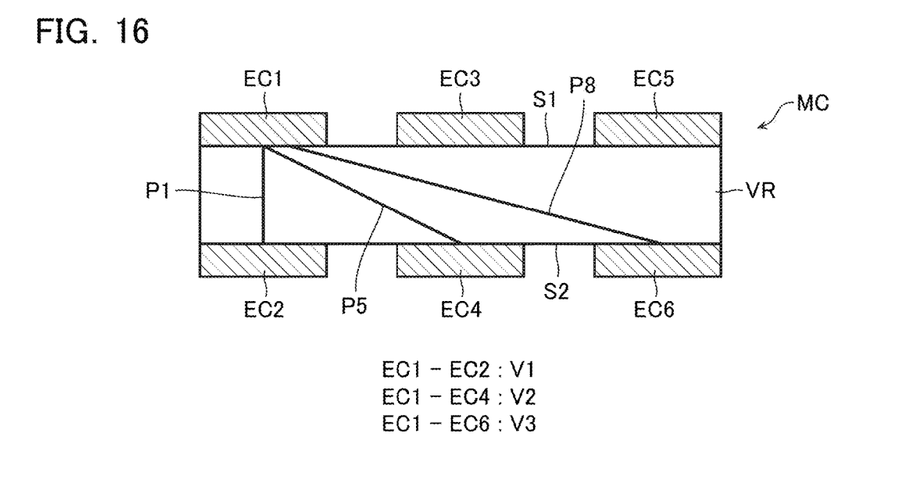
FIG. 16 is a schematic view showing operation of a semiconductor memory device according to a third embodiment.

Next, a semiconductor memory device according to a third embodiment will be described with reference to FIG. 16. An overall configuration of this third embodiment is similar to that of the first embodiment (FIGS. 1 and 2). However, in this third embodiment, values of voltages (potential differences) applied to the local bit lines LBL and the local word lines LWL in the write operation are different. Specifically, in this third embodiment, values of voltages applied between a selected local bit line LBL and local word line LWL differ according to a length of the filament path to be formed.

As an example, regarding the local bit lines LBL, the case where the local bit line LBL00 connected to the electrode EC1 is selected, will be considered. At this time, when the local word line LWL00 connected to the electrode EC2 is selected and the filament path P1 is formed, the local bit line LBL00 is applied with the voltage V1 and the local word line LWL00 is applied with 0 V. Other wiring lines are applied with, for example, the voltage V1/2, and other filament paths are prevented from being formed.

On the other hand, when the local word line LWL01 connected to the electrode EC4 is selected and the filament path P5 is formed, the local bit line LBL00 is applied with a voltage V2 (>V1) and the local word line LWL01 is applied with 0 V. Other wiring lines are applied with a voltage such as a voltage V2/2, and other filament paths are prevented from being formed. The reason that the voltage V2 applied to the local bit line LBL00 is made larger than the voltage V1 is because a length of the filament path P5 is longer than that of the filament path P1 and in the case that identical voltages have been set, it becomes difficult for the filament path P5 to be sufficiently formed or a write time lengthens.

Furthermore, when the local word line LWL02 connected to the electrode EC6 is selected and the filament path P8 is formed, the local bit line LBL00 is applied with a voltage V3 (>V2) and the local word line LWL02 is applied with 0 V. Other wiring lines are applied with a voltage such as a voltage V3/2, and other filament paths are prevented from being formed.

While an example where the local bit line LBL00 has been selected is described, but similar voltage adjustment can be performed also when the other local bit lines LBL01, LBL02 are selected.

In this way, in this third embodiment, the longer the length of the filament path to be formed is, the larger the voltage applied between the selected local bit line and local word line is made. In other words, in the third embodiment, magnitude of the applied voltage is adjusted according to a combination of the selected local bit line LBL and local word line LWL. Adjustment of the voltage is performed in the voltage generating circuit 14 based on a control signal of the control section 11. Due to such voltage adjustment being made, formation of a uniform filament path is enabled and speeding up and improvement in reliability of the write operation can be achieved, regardless of the length of the filament path to be formed.

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a plurality of global first wiring lines extending in a first direction;
a plurality of global second wiring lines extending in a second direction intersecting the first direction; and
a plurality of memory blocks each connected to one of the plurality of the global first wiring lines and one of the plurality of the global second wiring lines;
the memory block comprising:
a plurality of local first wiring lines extending in the first direction, the plurality of local first wiring lines being divided into a plurality of first wiring groups;
a plurality of local second wiring lines extending in the second direction, the plurality of local second wiring lines being divided into a plurality of second wiring groups; and
a plurality of memory cells each connected to a plurality of the local first wiring lines in one of the plurality of the first wiring groups and connected to a plurality of the local second wiring lines in one of the plurality of the second wiring groups,
the memory cell comprising:
a variable resistance element;
a plurality of first electrodes disposed on a first surface of the variable resistance element; and
a plurality of second electrodes disposed on a second surface of the variable resistance element different from the first surface,
the plurality of first electrodes are each connected to each of the local first wiring lines in one of the first wiring groups, and
the plurality of second electrodes are each connected to each of the local second wiring lines in one of the second wiring groups.

2. The semiconductor memory device according to claim 1, wherein
the plurality of first electrodes are disposed separated from each other in the second direction and are each connected to one of the plurality of local first wiring lines,
the plurality of second electrodes are disposed separated from each other in the second direction, and
each of the plurality of local second wiring lines is disposed so as to straddle the plurality of second electrodes in one memory cell and is connected to one of the plurality of second electrodes disposed in the one memory cell.

3. The semiconductor memory device according to claim 2 further comprising:
a plurality of conductors disposed between the plurality of local second wiring lines and the plurality of second electrodes, wherein
the plurality of local second wiring lines are each connected to the second electrode via a respective conductor.

4. The semiconductor memory device according to claim 3, wherein
positions of the plurality of conductors in the first direction are different from each other, and
positions of the plurality of conductors in the second direction are different from each other.

5. The semiconductor memory device according to claim 2, wherein
positions of end sections in the first direction of the plurality of first electrodes are different.

6. The semiconductor memory device according to claim 2, wherein
the memory cell has a first end section which is an end of the memory cell in the first direction and a second end section which is the other end of the memory cell in the first direction, and
at least one of the plurality of the first electrodes has an end section disposed between the first end section and the second end section.

7. The semiconductor memory device according to claim 6, wherein
the plurality of first electrodes includes a third electrode and a fourth electrode,
the third electrode has an end section positioned between the first end section and the second end section and the other end section positioned at the first end section, and
the fourth electrode has an end section positioned between the first end section and the second end section and the other end section positioned at the second end section.

8. The semiconductor memory device according to claim 7, wherein
the end section of the third electrode is nearer to the first end section than the end section of the fourth electrode, and
the end section of the fourth electrode is nearer to the second end section than the end section of the third electrode.

9. The semiconductor memory device according to claim 7, wherein
the end section of the third electrode is nearer to the second end section than the end section of the fourth electrode, and the end section of the fourth electrode is nearer to the first end section than the end section of the third electrode.

10. The semiconductor memory device according to claim 6, wherein
the plurality of first electrodes includes a third electrode and a fourth electrode,
each of the third electrode and the fourth electrode has end sections positioned at the second end section, and
the other end sections of the third electrode is positioned between the other end section of the fourth electrode and the second end section in the first direction.

11. The semiconductor memory device according to claim 1, further comprising
a control section selecting a local first wiring line in one of the first wiring groups, selecting a local second wiring line in one of the second wiring groups and controlling a voltage applied to the selected local first wiring line and the selected local second wiring line,
wherein the control section changes the voltage applied to the selected local first wiring line and the selected local second wiring line according to a combination of the selected local first wiring line and the selected local second wiring line.

12. The semiconductor memory device according to claim 1,
the memory block further comprising:
a first selector selecting the local first wiring line; and
a second selector selecting the local second wiring line.

13. The semiconductor memory device according to claim 12, wherein
the first selector is disposed for every one of the first wiring groups, and
the second selector is disposed for every one of the second wiring groups.

14. The semiconductor memory device according to claim 12, wherein
the first selector selects one of the local first wiring lines in the first wiring group and connects the selected local first wiring line to the global second wiring line, and
the second selector selects one of the local second wiring lines in the second wiring group and connects the selected local second wiring line to the global first wiring line.

15. A semiconductor memory device, comprising:
a plurality of global first wiring lines extending in a first direction;
a plurality of global second wiring lines extending in a second direction intersecting the first direction; and
a plurality of memory blocks, the memory block being connected to the global first wiring line and the global second wiring line;
the memory block comprising:
a plurality of local first wiring lines extending in the first direction, the plurality of local first wiring lines being divided into a plurality of first wiring groups;
a plurality of local second wiring lines extending in the second direction, the plurality of local second wiring lines being divided into a plurality of second wiring groups; and
a plurality of memory cells, the memory cell being connected to a plurality of local first wiring lines in one of the first wiring groups and connected to a plurality of local second wiring lines in one of the second wiring groups,
the memory cell comprising:
a variable resistance element;
a plurality of first electrodes disposed on a first surface of the variable resistance element, the first electrode being connected to the local first wiring line; and
a plurality of second electrodes disposed on a second surface of the variable resistance element different from the first surface, the second electrode being connected to the local second wiring line.

16. The semiconductor memory device according to claim 15, wherein
the memory cell has a first end section which is an end of the memory cell in the first direction and a second end section which is the other end of the memory cell in the first direction, and
at least one of the plurality of the first electrodes has an end section disposed between the first end section and the second end section.

17. The semiconductor memory device according to claim 16, wherein
the plurality of first electrodes includes a third electrode and a fourth electrode,
the third electrode has an end section positioned between the first end section and the second end section and the other end section positioned at the first end section, and
the fourth electrode has an end section positioned between the first end section and the second end section and the other end section positioned at the second end section.

18. The semiconductor memory device according to claim 17, wherein
the end section of the third electrode is nearer to the first end section than the end section of the fourth electrode, and
the end section of the fourth electrode is nearer to the second end section than the end section of the third electrode.

19. The semiconductor memory device according to claim 17, wherein
the end section of the third electrode is nearer to the second end section than the end section of the fourth electrode, and
the end section of the fourth electrode is nearer to the first end section than the end section of the third electrode.

20. The semiconductor memory device according to claim 16, wherein
the plurality of first electrodes includes a third electrode and a fourth electrode,
each of the third electrode and the fourth electrode has end sections positioned at the second end section, and
the other end sections of the third electrode is positioned between the other end section of the fourth electrode and the second end section in the first direction.

* * * * *